United States Patent
Park et al.

(10) Patent No.: US 9,553,120 B2
(45) Date of Patent: Jan. 24, 2017

(54) IMAGE SENSOR USING BACKSIDE ILLUMINATION PHOTODIODE AND METHOD FOR MANUFACTURING THE SAME

(71) Applicant: SiliconFile Technologies Inc., Seongnam-si, Gyeonggi-do (KR)

(72) Inventors: Jae Young Park, Seongnam-si (KR); Young Ha Lee, Seongnam-si (KR); Jun Ho Won, Seongnam-si (KR); Do Young Lee, Seongnam-si (KR)

(73) Assignee: SILICONFILE TECHNOLOGIES INC., Gyeonggi-do (KR)

( * ) Notice: Subject to any disclaimer, the term of this patent is extended or adjusted under 35 U.S.C. 154(b) by 0 days.

(21) Appl. No.: 14/529,783

(22) Filed: Oct. 31, 2014

(65) Prior Publication Data

US 2015/0115330 A1   Apr. 30, 2015

(30) Foreign Application Priority Data

Oct. 31, 2013   (KR) .................. 10-2013-0130838

(51) Int. Cl.
*H01L 27/146* (2006.01)

(52) U.S. Cl.
CPC ..... *H01L 27/14636* (2013.01); *H01L 27/1464* (2013.01); *H01L 27/1469* (2013.01); *H01L 27/14634* (2013.01)

(58) Field of Classification Search
CPC .......... H01L 27/14636; H01L 27/1464; H01L 27/1469; H01L 27/14634

USPC ........................................................ 257/226
See application file for complete search history.

(56) References Cited

U.S. PATENT DOCUMENTS

| 2006/0146233 A1* | 7/2006 | Park .................. H01L 27/14634 349/95 |
| 2012/0062777 A1* | 3/2012 | Kobayashi ........ H01L 27/14623 348/302 |

FOREIGN PATENT DOCUMENTS

| KR | 10-2009-0031903 | 3/2009 |
| KR | 10-2010-0019907 | 2/2010 |
| KR | 10-1017153 | 2/2011 |
| KR | 10-2011-0096275 | 8/2011 |
| KR | 10-2012-0007960 | 1/2012 |
| KR | 10-2013-0007652 | 1/2013 |

\* cited by examiner

*Primary Examiner* — Fernando L Toledo
*Assistant Examiner* — Adam S Bowen
(74) *Attorney, Agent, or Firm* — I P & T Group LLP

(57) ABSTRACT

A technology capable of simplifying a process and securing a misalignment margin when bonding two wafers to manufacture an image sensor using backside illumination photodiodes. When manufacturing an image sensor through a 3D CIS (CMOS image sensor) manufacturing process, two wafers, that is, a first wafer and a second wafer are electrically connected using the vias of one wafer and the bonding pads of the other wafer. Also, when manufacturing an image sensor through a 3D CIS manufacturing process, two wafers are electrically connected using the vias of both the two wafers.

8 Claims, 10 Drawing Sheets

IMAGE SENSOR USING BACKSIDE ILLUMINATION PHOTODIODE AND METHOD FOR MANUFACTURING THE SAME

BACKGROUND

1. Technical Field

The present disclosure relates to a technology for manufacturing an image sensor using a backside illumination photodiode, and more particularly, to an image sensor using a backside illumination photodiode and a method for manufacturing the same, in which a process may be simplified and a misalignment margin may be secured when bonding two wafers.

2. Related Art

FIG. 1 illustrates the structure of a conventional image sensor which is manufactured through a 3D CIS (CMOS image sensor) manufacturing process.

Referring to FIG. 1, an image sensor 100 includes a top wafer 100T which has a plurality of top metal layers 110T, a plurality of top vias 120T and a plurality of top bonding pads 130T, and a bottom wafer 100B which has a plurality of bottom metal layers 110B, a plurality of bottom vias 120B and a plurality of bottom bonding pads 130B.

The plurality of top metal layers 110T which are formed in the top wafer 100T are respectively electrically connected to the top bonding pads 130T through the top vias 120T with a corresponding number.

Similarly, the plurality of bottom metal layers 110B which are formed in the bottom wafer 100B are respectively electrically connected to the bottom bonding pads 130B through the bottom vias 120B with a corresponding number.

The top wafer 100T and the bottom wafer 100B are electrically connected by the top bonding pads 130T and the bottom bonding pads 130B which are formed to face each other.

In this way, the conventional image sensor 100 has a structure in which the top wafer 100T and the bottom wafer 100B are electrically connected with each other by the top bonding pads 130T which are formed to correspond to the number of the top metal layers 110T in the top wafer 100T and the bottom bonding pads 130B which are formed to correspond to the number of the bottom metal layers 110B in the bottom wafer 100B.

However, the image sensor 100 structured in this way may be encountered with a problem in that the characteristics of pixels are likely to deteriorate due to the parasitic capacitance induced in the pluralities of bonding pads 130T and 130B. Also, another problem may be caused in that a process margin is likely to become insufficient due to a misalignment.

SUMMARY

Various embodiments are directed to electrically connecting two wafers by using the vias of one wafer of a first wafer and a second wafer and the bonding pads of the other wafer when manufacturing an image sensor through a 3D CIS (CMOS image sensor) manufacturing process.

Also, various embodiments are directed to electrically connecting two wafers by using the vias of the two wafers when manufacturing an image sensor through a 3D CIS (CMOS image sensor) manufacturing process.

In an embodiment, an image sensor using backside illumination photodiodes may include: a plurality of first metal layers formed in a first wafer including a plurality of backside illumination photodiodes which sense light incident from a backside and output signals and a plurality of transfer transistors which transfer the signals outputted from the backside illumination photodiodes, to floating diffusion nodes, the plurality of first metal layers being electrically connected with the floating diffusion nodes, respectively; a plurality of second metal layers formed in a second wafer including a plurality of pixel transistors which process signals transferred through the floating diffusion nodes and transfer processed signals, the plurality of second metal layers being electrically connected with the pixel transistors, respectively; a plurality of first bonding vias formed in the first wafer, and having one ends which are electrically connected to the first metal layers, respectively; a plurality of second bonding vias formed in the second wafer, and having one ends which are electrically connected to the second metal layers, respectively; and a plurality of bonding pads formed in the first wafer, and having one ends which are electrically connected with the other ends, respectively, of the first bonding vias and the other ends which are electrically connected with the other ends, respectively, of the second bonding vias.

In an embodiment, an image sensor using backside illumination photodiodes may include: a plurality of first metal layers formed in a first wafer including a plurality of backside illumination photodiodes which sense light incident from a backside and output signals and a plurality of transfer transistors which transfer the signals outputted from the backside illumination photodiodes, to floating diffusion nodes, the plurality of first metal layers being electrically connected with the floating diffusion nodes, respectively; a plurality of second metal layers formed in a second wafer including a plurality of pixel transistors which process signals transferred through the floating diffusion nodes and transfer processed signals, the plurality of second metal layers being electrically connected with the pixel transistors, respectively; a plurality of first bonding vias formed in the first wafer, and having one ends which are electrically connected to the first metal layers, respectively; a plurality of second bonding vias formed in the second wafer, and having one ends which are electrically connected to the second metal layers, respectively; and a plurality of bonding pads formed in the second wafer, and having one ends which are electrically connected with the other ends, respectively, of the second bonding vias and the other ends which are electrically connected with the other ends, respectively, of the first bonding vias.

In an embodiment, an image sensor using backside illumination photodiodes may include: a plurality of first metal layers formed in a first wafer including a plurality of backside illumination photodiodes which sense light incident from a backside and output signals and a plurality of transfer transistors which transfer the signals outputted from the backside illumination photodiodes, to floating diffusion nodes, the plurality of first metal layers being electrically connected with the floating diffusion nodes, respectively; a plurality of second metal layers formed in a second wafer including a plurality of pixel transistors which process signals transferred through the floating diffusion nodes and transfer processed signals, the plurality of second metal layers being electrically connected with the pixel transistors, respectively; a plurality of first bonding vias formed in the first wafer, and having one ends which are electrically connected to the first metal layers, respectively; and a plurality of second bonding vias formed in the second wafer, and having one ends which are electrically connected to the second metal layers, respectively, and the other ends which are electrically connected to the other ends of the first bonding vias, respectively.

In an embodiment, an image sensor using backside illumination photodiodes may include: a plurality of first metal layers formed in a first wafer including a plurality of backside illumination photodiodes which sense light incident from a backside and output signals, a plurality of transfer transistors which transfer the signals outputted from the backside illumination photodiodes, to floating diffusion nodes, and a plurality of pixel transistors for transferring the output signals of the backside illumination photodiodes to corresponding pixels, the plurality of first metal layers being electrically connected with the pixel transistors, respectively; a plurality of second metal layers formed in a second wafer including a plurality of logic transistors for processing signals outputted through the pixel transistors, the plurality of second metal layers being electrically connected with the logic transistors, respectively; a plurality of first bonding vias formed in the first wafer, and having one ends which are electrically connected to the first metal layers, respectively; a plurality of second bonding vias formed in the second wafer, and having one ends which are electrically connected to the second metal layers, respectively; and a plurality of bonding pads formed in the first wafer, and having one ends which are electrically connected with the other ends, respectively, of the first bonding vias and the other ends which are electrically connected with the other ends, respectively, of the second bonding vias.

In an embodiment, a method for manufacturing an image sensor using backside illumination photodiodes may include: (a) forming a plurality of backside illumination photodiodes which sense light incident from a backside and output signals and a plurality of transfer transistors which transfer the output signals of the backside illumination photodiodes to floating diffusion nodes, in a first wafer, and forming a plurality of first bonding vias which are electrically connected with the floating diffusion nodes, in an interlayer dielectric layer of the first wafer; (b) forming a plurality of pixel transistors for processing the output signals of the backside illumination photodiodes and transferring processed signals, in a second wafer, forming a plurality of second bonding vias which are electrically connected with the pixel transistors, in an interlayer dielectric layer of the second wafer, and forming bonding pads on the second bonding vias; and (c) bonding the first wafer and the second wafer, and electrically connecting the first bonding vias and the bonding pads with each other.

In an embodiment, a method for manufacturing an image sensor using backside illumination photodiodes may include: (a) forming a plurality of backside illumination photodiodes which sense light incident from a backside and output signals and a plurality of transfer transistors which transfer the output signals of the backside illumination photodiodes to floating diffusion nodes, in a first wafer, and forming a plurality of first bonding vias which are electrically connected with the floating diffusion nodes, in an interlayer dielectric layer of the first wafer; (b) forming a plurality of pixel transistors for processing the output signals of the backside illumination photodiodes and transferring processed signals, in a second wafer, and forming a plurality of second bonding vias which are electrically connected with the pixel transistors, in an interlayer dielectric layer of the second wafer; and (c) bonding the first wafer and the second wafer, and electrically connecting the first bonding vias and the second bonding vias with each other.

Figure 6:
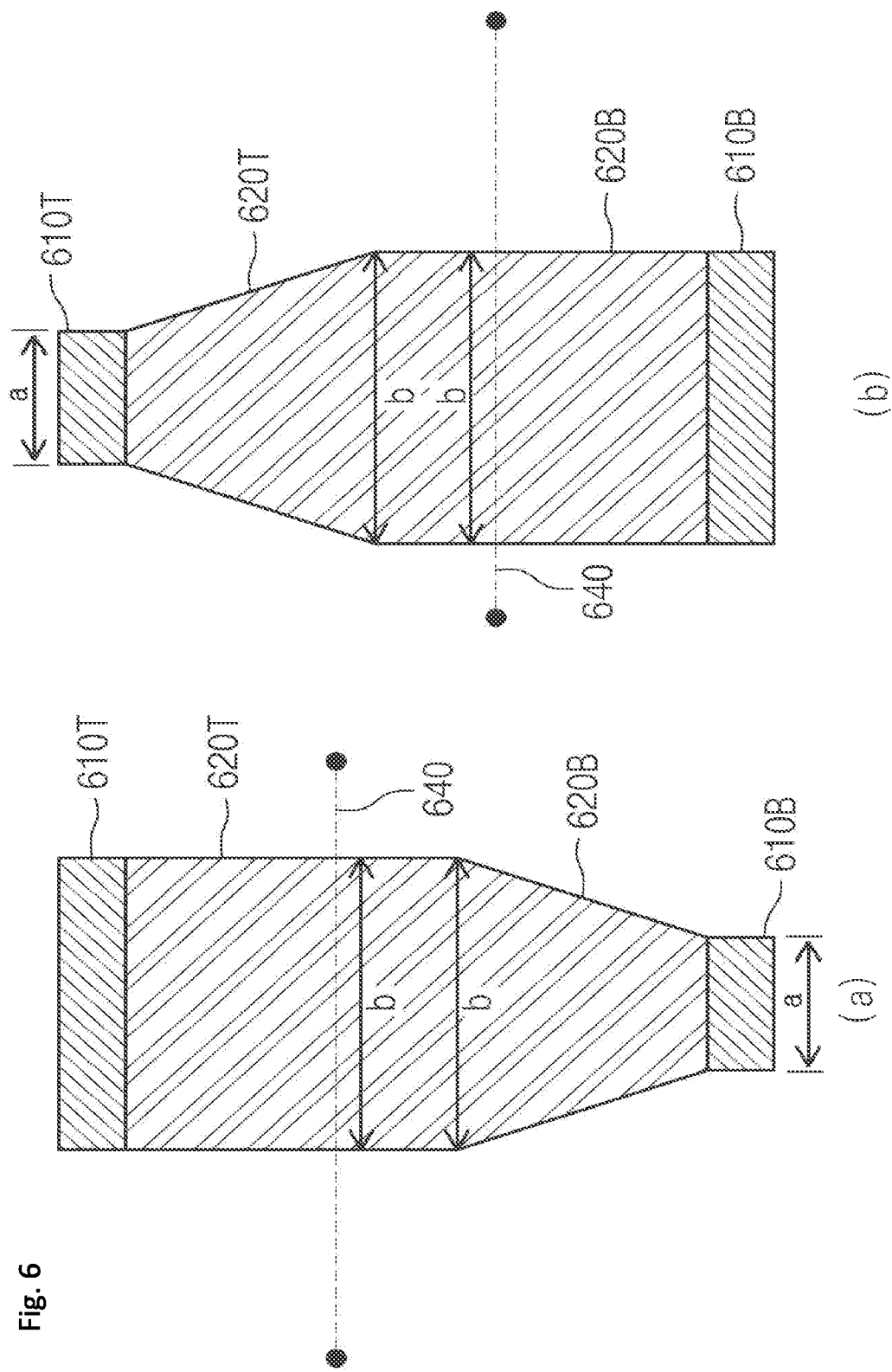

(a) and (b) of FIG. 6 are views illustrating examples of the structures of vias in the case where the sizes of a first metal layer and a second metal layer are different from each other.

Figure 7:
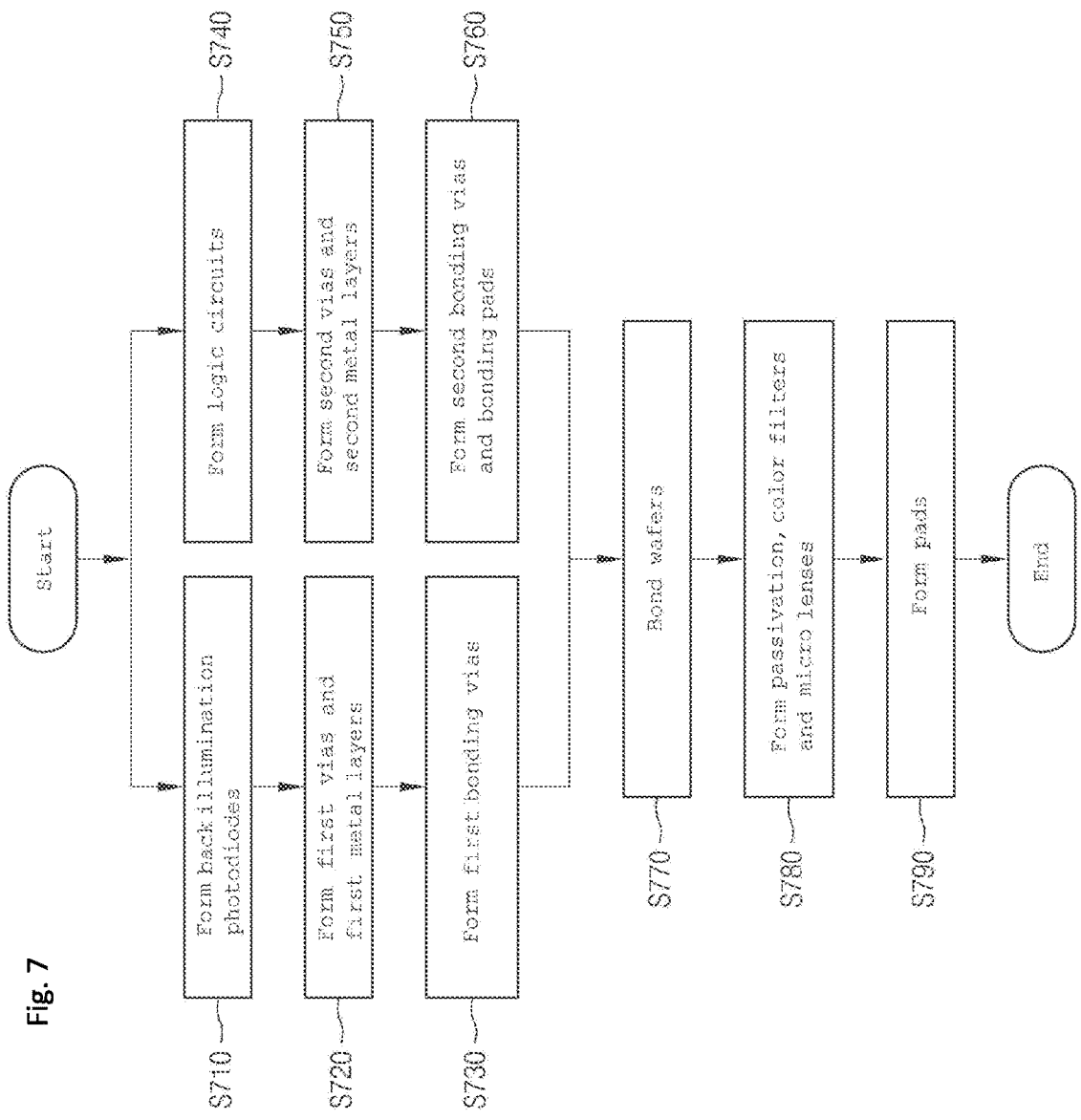

FIG. 7 is a flow chart to assist in the explanation of a method for manufacturing an image sensor using a backside illumination photodiode in accordance with an embodiment.

Figure 8:
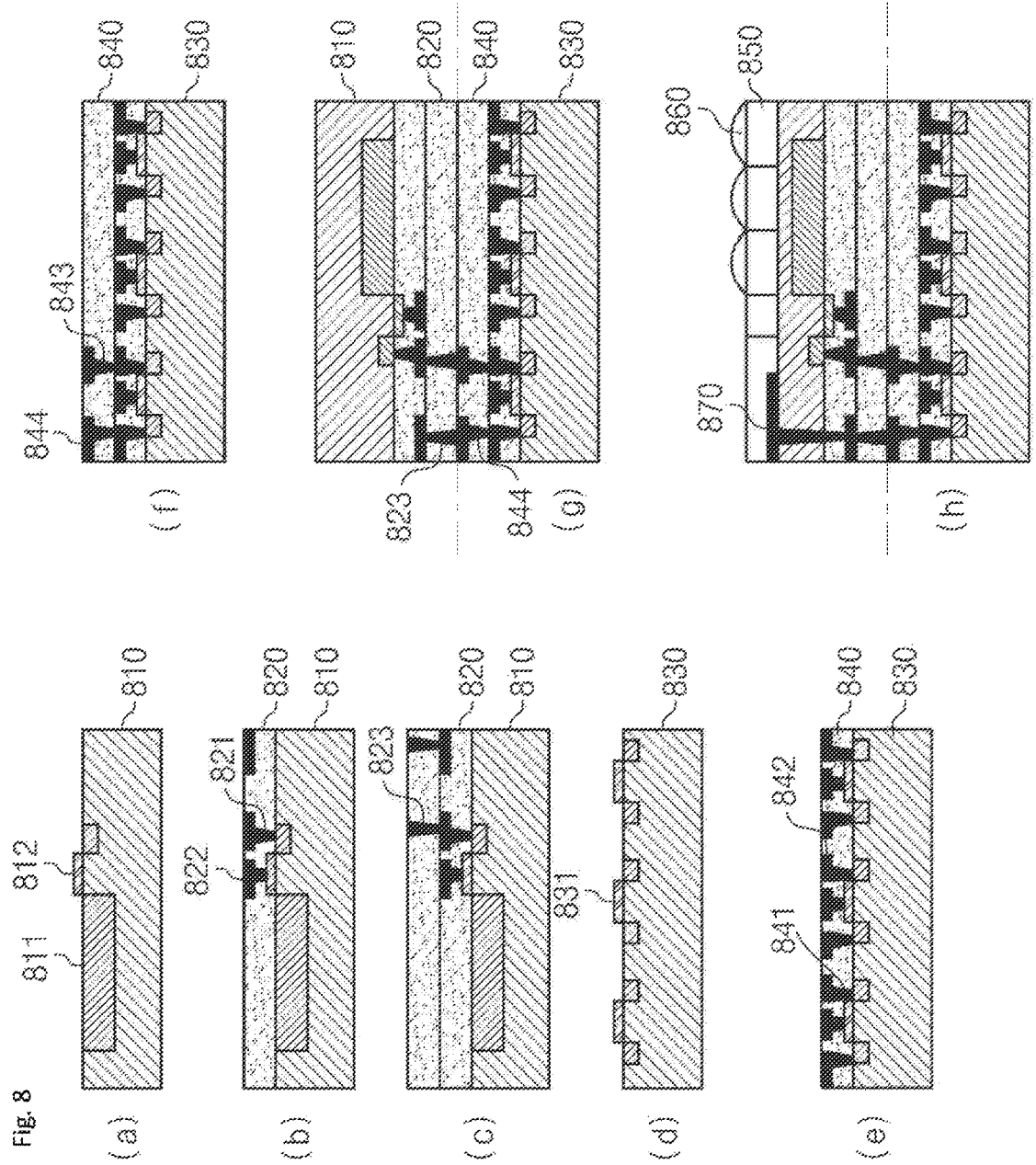

FIG. 8 is of cross-sectional views of an image sensor, illustrating image sensor manufacturing processes according to the method of FIG. 7.

Figure 9:
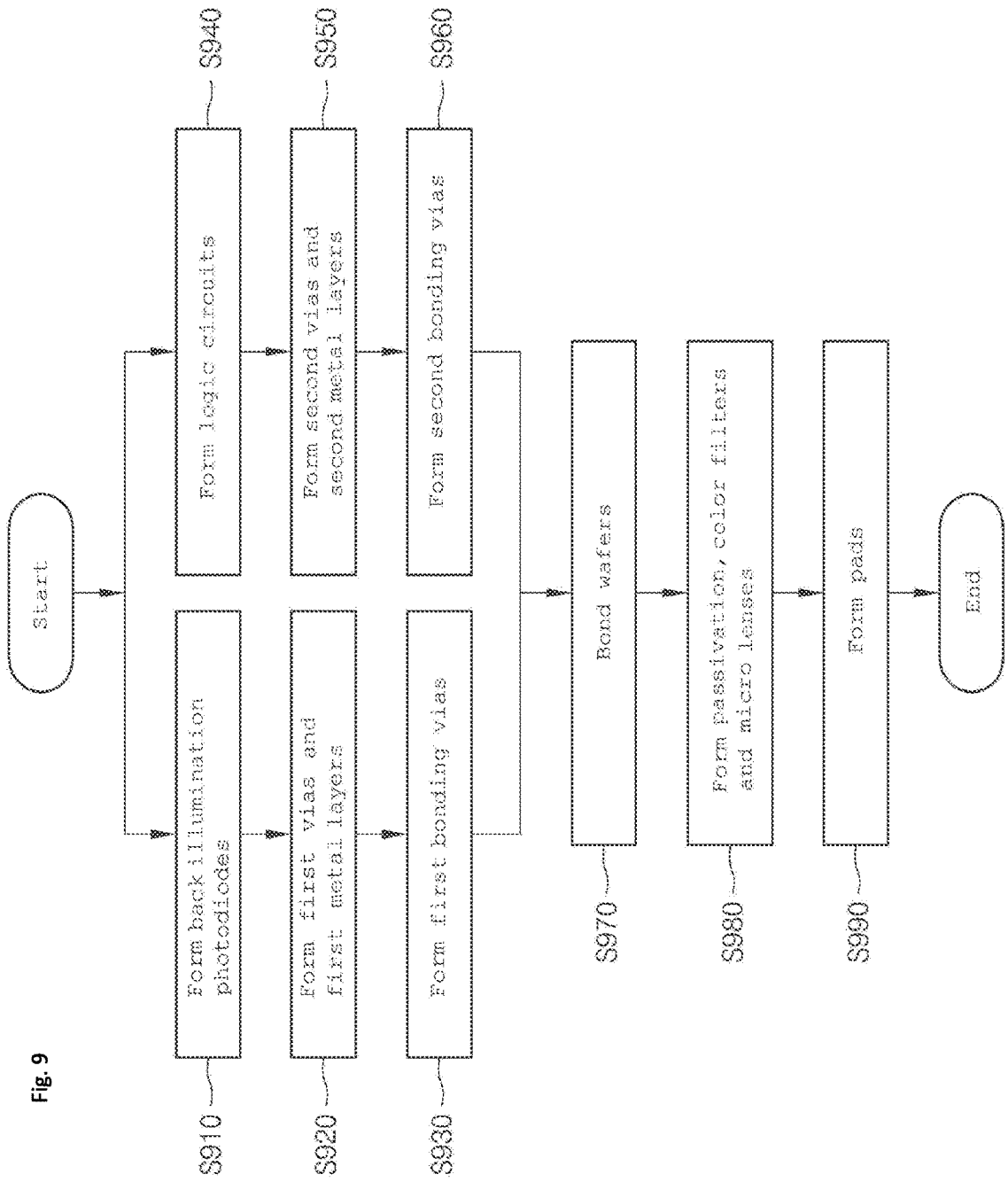

FIG. 9 is a flow chart to assist in the explanation of a method for manufacturing an image sensor using a backside illumination photodiode in accordance with another embodiment.

Figure 10:
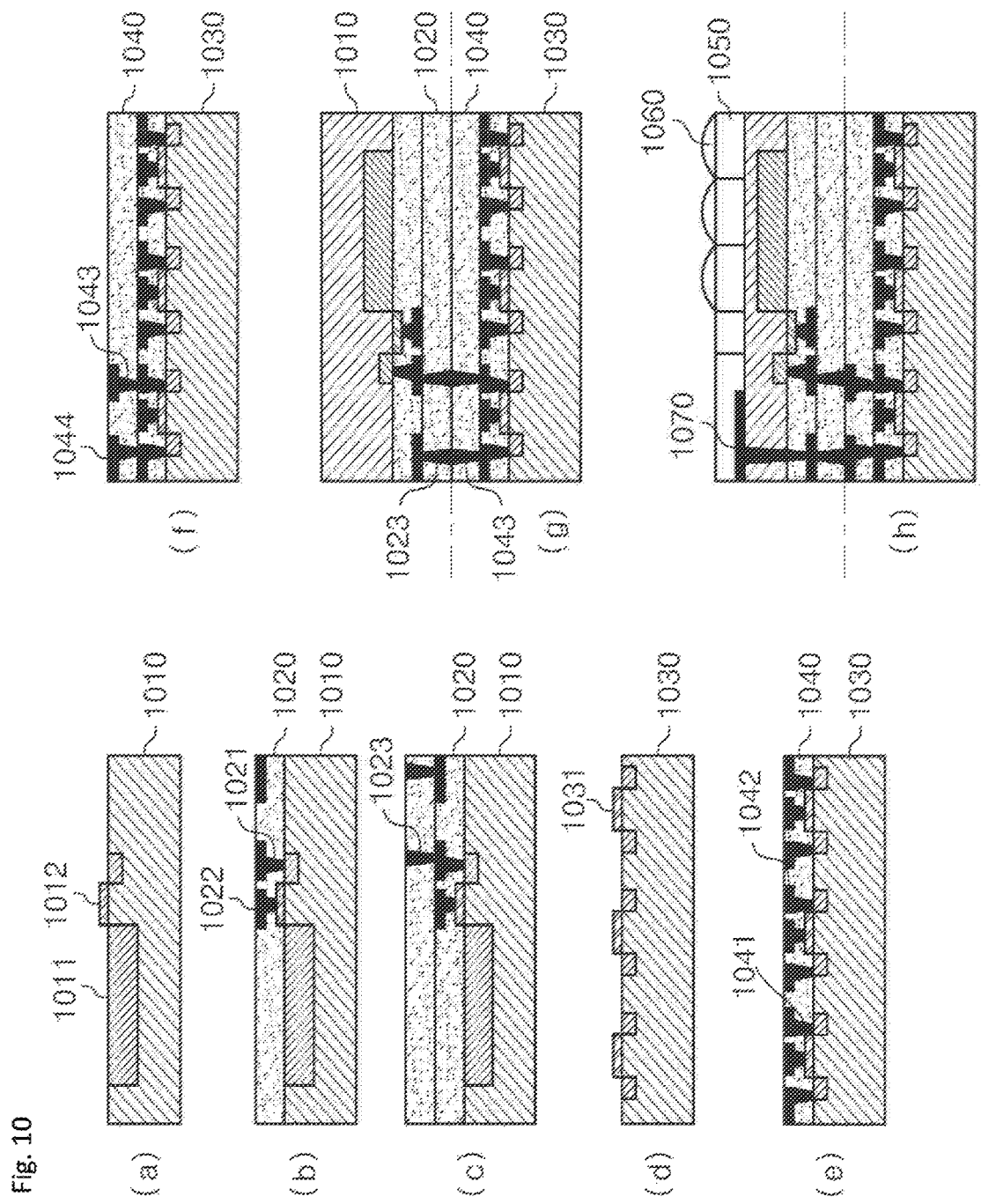

FIG. 10 is of cross-sectional views of an image sensor, illustrating image sensor manufacturing processes according to the method of FIG. 9.

DETAILED DESCRIPTION

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Figure 1:
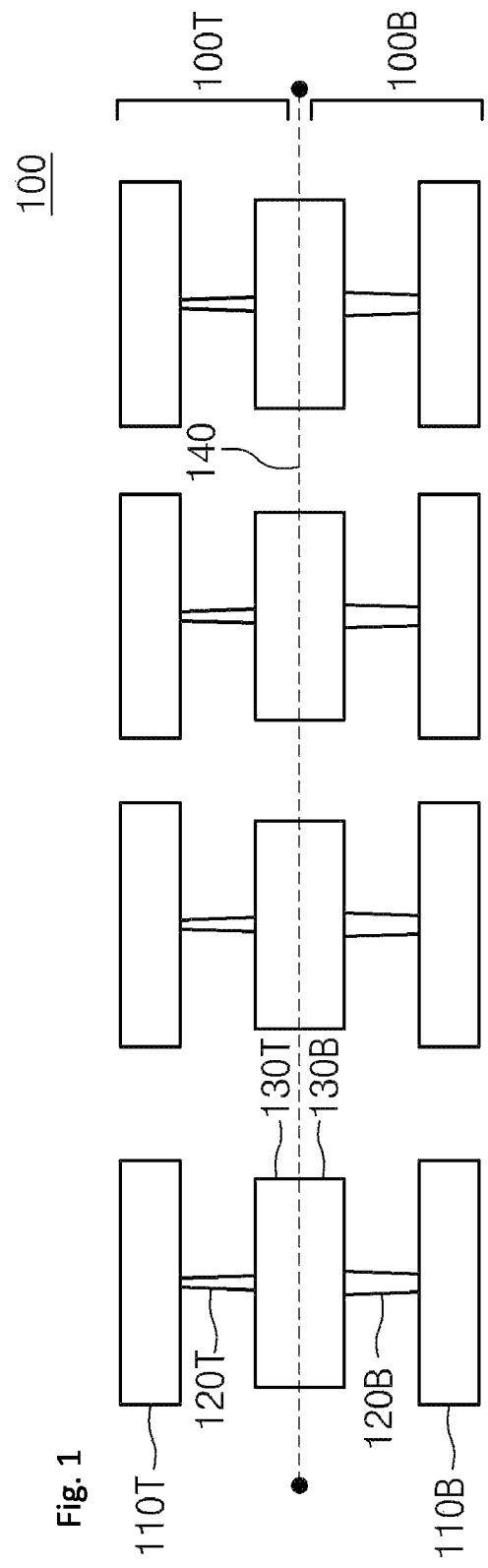
FIG. 1 is a view illustrating the structure of a conventional image sensor manufactured through a 3D CIS (CMOS image sensor) manufacturing process.
Figure 2:
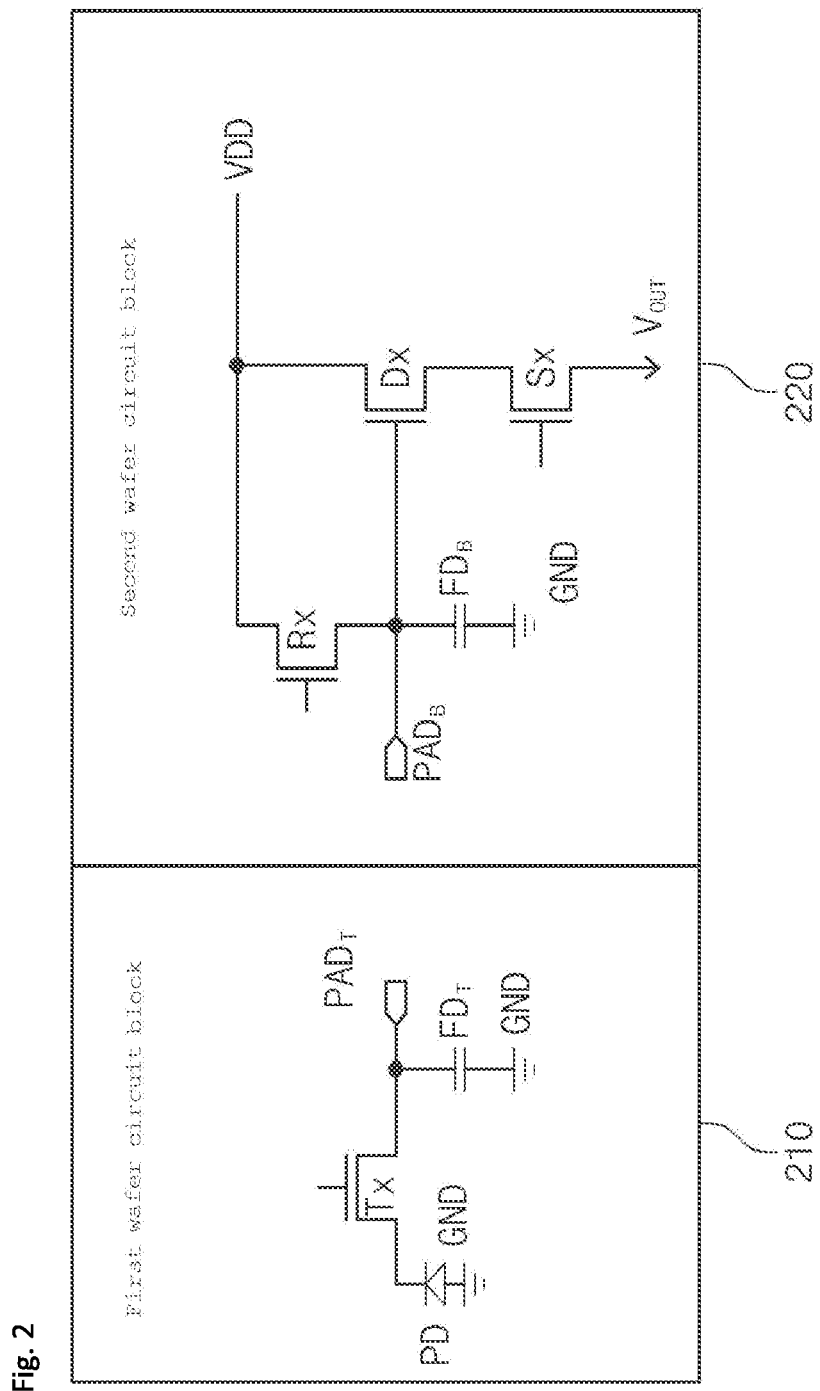
FIG. 2 is a circuit diagram of a pixel to which an image sensor using a backside illumination photodiode in accordance with an embodiment is applied.

FIG. 2 illustrates an example of a pixel circuit to which an image sensor using a backside illumination photodiode in accordance with an embodiment is applied. The pixel circuit includes a first wafer circuit block 210 and a second wafer circuit block 220.

The first wafer circuit block 210 includes a photodiode PD, a transfer transistor Tx, and a first floating diffusion node $FD_T$. The second wafer circuit block 220 includes a second floating diffusion node $FD_B$, a reset transistor Rx, a drive transistor Dx, and a select transistor Sx.

The charges produced by the sensing operation of the photodiode PD are transferred to the first floating diffusion node $FD_T$ through the transfer transistor Tx which is formed in a first wafer.

In a second wafer, the drive transistor Dx and the select transistor Sx are electrically connected in series between a power terminal VDD and an output terminal $V_{OUT}$, and the charges transferred through the first floating diffusion node $FD_T$ are transferred to the gate of the drive transistor Dx through the second floating diffusion node $FD_B$ which is formed in the second wafer.

Accordingly, an output voltage corresponding to the light sensed through the photodiode PD is supplied to a corresponding pixel through the drive transistor Dx and the select transistor Sx. In the second wafer, the reset transistor Rx is electrically connected between the power terminal VDD and the gate of the drive transistor Dx. The reset transistor Rx plays the role of supplying the voltage of the power terminal VDD to the gate of the drive transistor Dx and thereby resetting the second floating diffusion node $FD_B$ which is electrically connected with the drive transistor Dx, in a reset mode.

Figure 3:
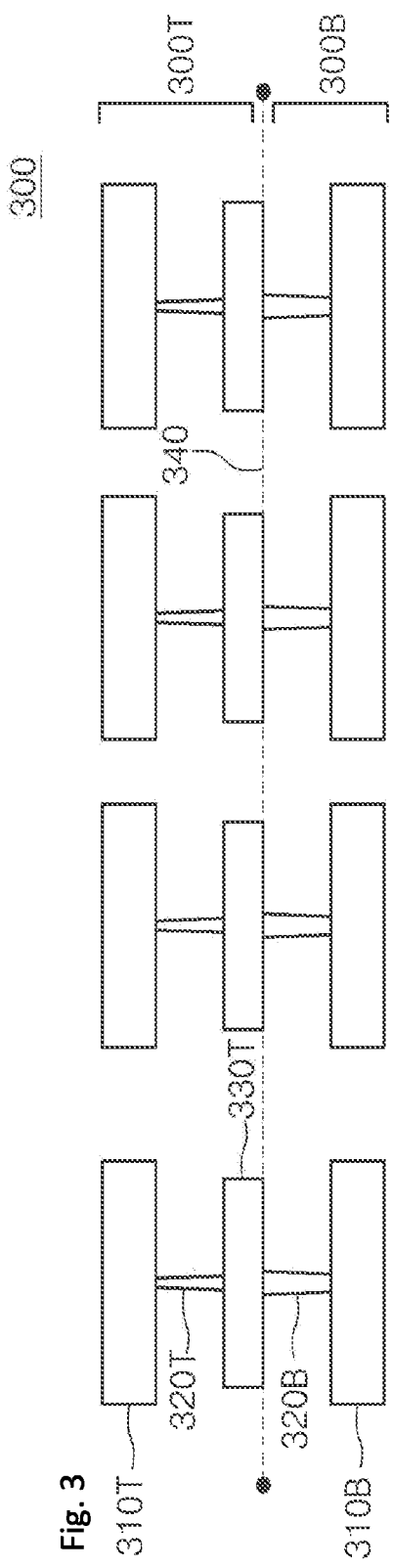
FIG. 3 is a schematic cross-sectional view illustrating an image sensor using a backside illumination photodiode in accordance with an embodiment.

FIG. 3 is a schematic cross-sectional view illustrating an image sensor using a backside illumination photodiode in accordance with an embodiment.

Referring to FIG. 3, an image sensor 300 includes a first wafer 300T which has a plurality of first metal layers 310T, a plurality of first bonding vias 320T and a plurality of bonding pads 330T, and a second wafer 300B which has a plurality of second metal layers 310B and a plurality of second bonding vias 320B.

The first wafer 300T may be a top wafer, and a second wafer 300B may be a bottom wafer.

The plurality of first metal layers 310T which are formed in the first wafer 300T are respectively electrically connected to the bonding pads 330T through the first bonding vias 320T with a corresponding number.

In comparison with this, in the second wafer 300B, bonding pads are omitted, and one ends of the second bonding vias 320B are formed to a bonding surface 340 as an interface where the first wafer 300T and the second wafer 300B contact each other when they are bonded. The plurality of second metal layers 310B which are formed in the second wafer 300B are respectively electrically connected to the second bonding vias 320B with a corresponding number.

The electrical connection of the first wafer 300T and the second wafer 300B is implemented by the bonding pads 330T and the second bonding vias 320B which are formed to face each other. The physical coupling of the first wafer 300T and the second wafer 300B may be realized in a variety of ways such as nitride bonding, metal bonding and oxide bonding.

The materials of the first bonding vias 320T and the bonding pads 330T of the first wafer 300T and the second bonding vias 320B of the second wafer 300B may include Cu although they are not specifically limited, and in this case, a dual damascene process may be applied.

The first wafer 300T may include backside illumination photodiodes which sense light incident from a backside and output signals, and transfer transistors which transfer the signals outputted from the backside illumination photodiodes, to floating diffusion nodes. One terminals of the transfer transistors are electrically connected to the backside illumination photodiodes, and the other terminals of the transfer transistors are electrically connected to the first bonding vias 320T.

The second wafer 300B may include pixel transistors (for example, reset transistors, drive transistors and select transistors) for transferring signals corresponding to the light sensed through the backside illumination photodiodes, to corresponding pixels, and logic transistors which are formed in a peripheral circuit region to process the signals outputted from the pixel transistors. One terminals of the pixel transistors are electrically connected to the second metal layers 310B.

Each of the first wafer 300T and the second wafer 300B may include an interlayer dielectric layer.

Figure 4:
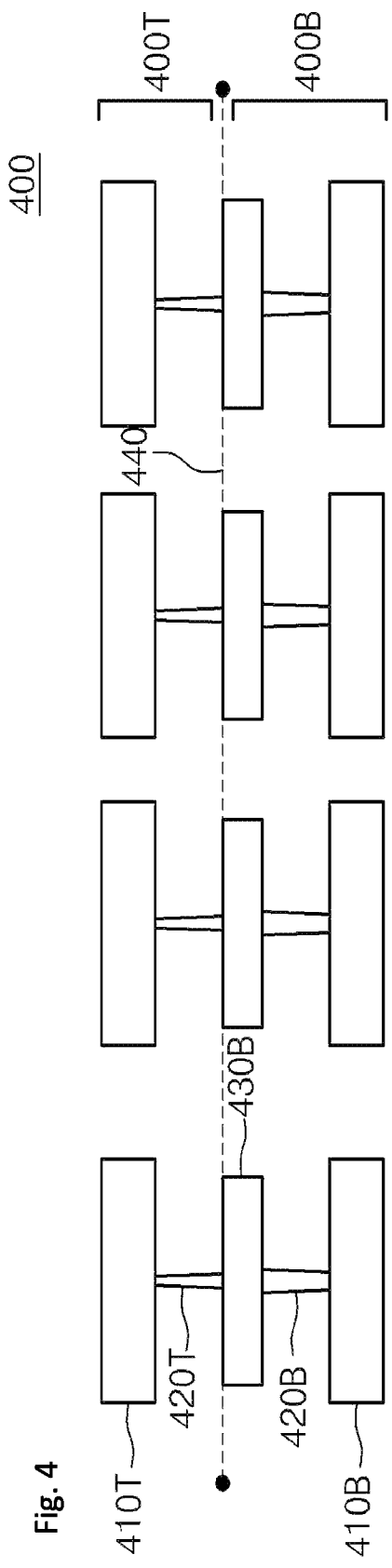
FIG. 4 is a schematic cross-sectional view illustrating an image sensor using a backside illumination photodiode in accordance with another embodiment.

FIG. 4 is a schematic cross-sectional view illustrating an image sensor using a backside illumination photodiode in accordance with another embodiment. When comparing FIG. 4 with FIG. 3, a difference resides in that bonding pads are omitted in a first wafer and are formed in a second wafer and the first wafer and the second wafer are bonded by the vias of the first wafer and the bonding pads of the second wafer.

Referring to FIG. 4, an image sensor 400 includes a first wafer 400T which has a plurality of first metal layers 410T and a plurality of first bonding vias 420T, and a second wafer 400B which has a plurality of second metal layers 410B, a plurality of second bonding vias 420B and a plurality of bonding pads 430B.

The first wafer 400T may be a top wafer, and a second wafer 400B may be a bottom wafer.

In the first wafer 400T, bonding pads are omitted, and one ends of the first bonding vias 420T are formed to a bonding surface 440 as an interface where the first wafer 400T and the second wafer 400B contact each other when they are bonded. The plurality of first metal layers 410T which are formed in the first wafer 400T are respectively electrically connected to the first bonding vias 420T with a corresponding number.

In comparison with this, the plurality of second metal layers 410B which are formed in the second wafer 400B are respectively electrically connected to the bonding pads 430B through the second bonding vias 420B with a corresponding number.

The electrical connection of the first wafer 400T and the second wafer 400B is implemented by the first bonding vias 420T and the bonding pads 430B which are formed to face each other. The physical coupling of the first wafer 400T and the second wafer 400B may be realized in a variety of ways such as nitride bonding, metal bonding and oxide bonding.

The materials of the first bonding vias 420T of the first wafer 400T and the second bonding vias 420B and the bonding pads 430B of the second wafer 400B may include Cu although they are not specifically limited, and in this case, a dual damascene process may be applied.

The first wafer 400T may include backside illumination photodiodes which sense light incident from a backside and output signals, and transfer transistors which transfer the signals outputted from the backside illumination photodiodes, to floating diffusion nodes. One terminals of the transfer transistors are electrically connected to the backside illumination photodiodes, and the other terminals of the transfer transistors are electrically connected to the first bonding vias 420T.

The second wafer 400B may include pixel transistors (for example, reset transistors, drive transistors and select transistors) for transferring signals corresponding to the light sensed through the backside illumination photodiodes, to corresponding pixels, and logic transistors which are formed in a peripheral circuit region to process the signals outputted from the pixel transistors. One terminals of the pixel transistors are electrically connected to the second metal layers 410B.

Each of the first wafer 400T and the second wafer 400B may include an interlayer dielectric layer.

Figure 5:
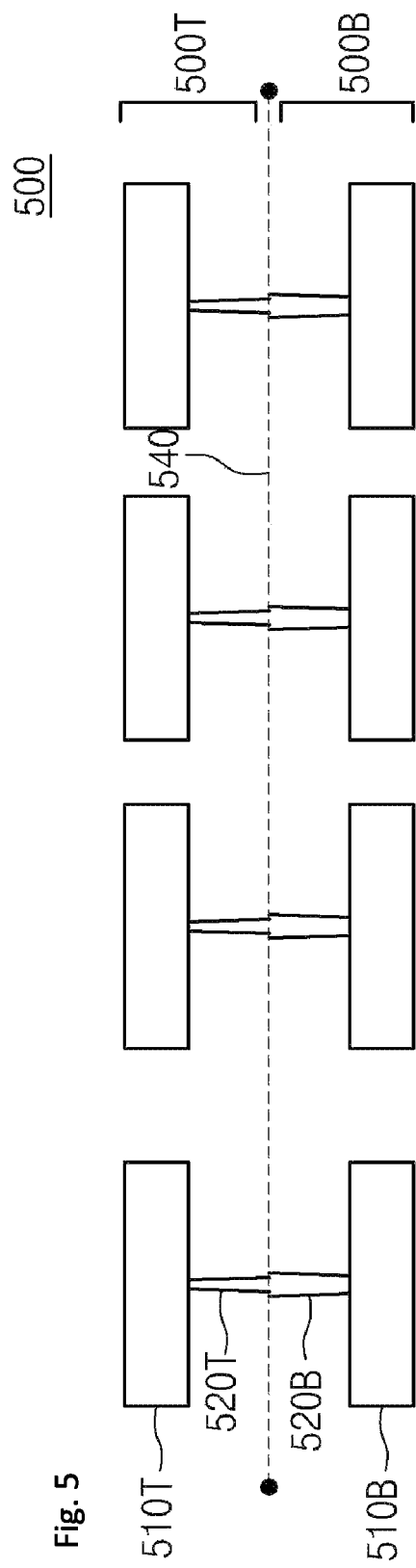
FIG. 5 is a schematic cross-sectional view illustrating an image sensor using a backside illumination photodiode in accordance with still another embodiment.

FIG. 5 is a schematic cross-sectional view illustrating an image sensor using a backside illumination photodiode in accordance with still another embodiment.

Referring to FIG. 5, an image sensor 500 includes a first wafer 500T which has a plurality of first metal layers 510T and a plurality of first bonding vias 520T, and a second wafer 500B which has a plurality of second metal layers 510B and a plurality of second bonding vias 520B.

The first wafer 500T may be a top wafer, and a second wafer 500B may be a bottom wafer.

The plurality of first metal layers 510T which are formed in the first wafer 500T are respectively electrically connected with the first bonding vias 520T with a corresponding number.

In the same manner, the plurality of second metal layers 510B which are formed in the second wafer 500B are respectively electrically connected with the second bonding vias 520B with a corresponding number.

The electrical connection of the first wafer 500T and the second wafer 500B is implemented by the first bonding vias 520T and the second bonding vias 520B which are formed to face each other. The physical coupling of the first wafer 500T and the second wafer 500B may be realized in a variety of ways such as nitride bonding, metal bonding and oxide bonding.

The materials of the first bonding vias 520T of the first wafer 500T and the second bonding vias 520B of the second wafer 500B may include Cu although they are not specifically limited, and in this case, a dual damascene process may be applied.

The first wafer 500T may include backside illumination photodiodes which sense light incident from a backside and output signals, and transfer transistors which transfer the signals outputted from the backside illumination photodiodes, to floating diffusion nodes. One terminals of the transfer transistors are electrically connected to the backside illumination photodiodes, and the other terminals of the transfer transistors are electrically connected to the first bonding vias 520T.

The second wafer 500B may include pixel transistors (for example, reset transistors, drive transistors and select transistors) for transferring signals corresponding to the light sensed through the backside illumination photodiodes, to corresponding pixels, and logic transistors which are formed in a peripheral circuit region to process the signals outputted from the pixel transistors. One terminals of the pixel transistors are electrically connected to the second metal layers 510B.

Each of the first wafer 500T and the second wafer 500B may include an interlayer dielectric layer.

The size of the first bonding vias 520T and the size of the second bonding vias 520B are not specifically limited, and may be the same with or different from each other according to a design rule.

(a) and (b) of FIG. 6 illustrate examples of electrically connecting two wafers through bonding vias as in FIG. 5. That is to say, (a) and (b) of FIG. 6 are views illustrating examples of the structures of vias in the case where the sizes of a first metal layer 610T and a second metal layer 610B are different from each other.

First, (a) of FIG. 6 shows an example of forming a first bonding via 620T and a second bonding via 620B in the case where the size of the first metal layer 610T is larger than the size of the second metal layer 610B. In other words, there are shown the structures of the first bonding via 620T and the second bonding via 620B in the case where the relationship between a width (or diameter) "b" of the first metal layer 610T and a width (or diameter) "a" of the second metal layer 610B is b>a.

In such a case, in the first bonding via 620T, a portion, which contacts the first metal layer 610T, a portion, which contacts a bonding surface 640 as an interface where a first wafer 600T and a second wafer 600B contact each other when they are bonded, and an intermediate portion, which connects the two portions, are all formed uniformly to have the width "b".

In comparison with this, in the second bonding via 620B, a portion, which contacts the second metal layer 610B, is formed to have the width "a" (for example, a=0.4 μm) in correspondence to the size of the second metal layer 610B, a portion, which contacts the bonding surface 640, is formed to have the width "b" (for example, b=0.8 μm) in the same manner as the corresponding surface of the first bonding via 620T, and an intermediate portion, which connects the two portions, is formed to be inclined (for example, to an angle of 3° to 10°), by changing a via etch recipe.

By doing this, when connecting two vias with different pitches, the sizes of bonding contact surfaces may be determined to be the same with each other, and thereby, a bonding force may be increased.

(b) of FIG. 6 shows an example of forming a first bonding via 620T and a second bonding via 620B in the case where the size of the first metal layer 610T is smaller than the size of the second metal layer 610B. In other words, there are shown the structures of the first bonding via 620T and the second bonding via 620B in the case where the relationship between a width (or diameter) "a" of the first metal layer 610T and a width (or diameter) "b" of the second metal layer 610B is b>a. Because the structures of the first bonding via 620T and the second bonding via 620B define a reverse symmetry with respect to the structures of (a) of FIG. 6, detailed descriptions thereof will be omitted.

FIG. 7 is a flow chart to assist in the explanation of a method for manufacturing an image sensor using a backside illumination photodiode in accordance with an embodiment, and FIG. 8 is of cross-sectional views of an image sensor, illustrating image sensor manufacturing processes according to the method of FIG. 7.

The method for manufacturing an image sensor using a backside illumination photodiode in accordance with the embodiment will be described below in detail with reference to FIGS. 7 and 8.

First, as shown in (a) of FIG. 8, on a first wafer 810, backside illumination photodiodes 811, which sense light incident from a backside and output signals, and transfer transistors 812, which transfer the signals outputted from the backside illumination photodiodes 811, to floating diffusion nodes, are formed (S710).

Then, as shown in (b) of FIG. 8, first vias 821, which are electrically connected with the transfer transistors 812, are formed in a first interlayer dielectric layer 820 on the first wafer 810, and first metal layers 822 are formed on the first vias 821 (S720).

As shown in (c) of FIG. 8, first bonding vias 823 are formed on the first metal layers 822 (S730).

For reference, the first bonding vias 823 perform the same function as the first bonding vias 420T of FIG. 4.

At the same time with forming the backside illumination photodiodes 811, the transfer transistors 812, the first vias 821 for electrical connection of circuits and the first bonding vias 823 for electrical connection of wafers, on the first wafer 810 as described above, the following elements are formed on a second wafer 830.

As shown in (d) of FIG. 8, on the second wafer 830, pixel transistors 831 (for example, reset transistors, drive transistors and select transistors) for transferring signals corresponding to the light sensed through the backside illumination photodiodes 811, to corresponding pixels are formed (S740).

Next, as shown in (e) of FIG. 8, second vias 841, which are electrically connected with the pixel transistors 831, are formed in a second interlayer dielectric layer 840 on the second wafer 830, and second metal layers 842 are formed on the second vias 841 (S750).

As shown in (f) of FIG. 8, second bonding vias 843 and bonding pads 844 are sequentially formed on the second metal layers 842 (S760).

For reference, the second bonding vias 843 perform the same function as the second bonding vias 420B of FIG. 4.

Thereafter, as shown in (g) of FIG. 8, the first interlayer dielectric layer 820 on the first wafer 810 and the second interlayer dielectric layer 840 on the second wafer 830 are bonded with each other, and at this time, the first bonding vias 823 in the first interlayer dielectric layer 820 and the bonding pads 844 in the second interlayer dielectric layer 840 are electrically connected with each other (S770).

Thereupon, as shown in (h) of FIG. 8, a passivation process, a process for forming color filters 850 and a process for forming microlenses 860 are performed (S780), and finally, a process for forming pads 870 is performed (S790).

While it was described above as an example that the first bonding vias 823 on the first wafer 810 and the bonding pads 844 on the second wafer 830 are electrically connected with each other, it is to be noted that the disclosure is not limited to such, and it is possible to electrically connect the bonding pads of a first wafer and bonding vias of a second wafer through appropriate processes.

FIG. 9 is a flow chart to assist in the explanation of a method for manufacturing an image sensor using a backside illumination photodiode in accordance with another embodiment, and FIG. 10 is of cross-sectional views of an image sensor, illustrating image sensor manufacturing processes according to the method of FIG. 9.

The method for manufacturing an image sensor using a backside illumination photodiode in accordance with another embodiment will be described below in detail with reference to FIGS. 9 and 10.

First, as shown in (a) of FIG. 10, on a first wafer 1010, backside illumination photodiodes 1011, which sense light incident from a backside and output signals, and transfer transistors 1012, which transfer the signals outputted from the backside illumination photodiodes 1011, to floating diffusion nodes, are formed (S910).

The transfer transistors 1012 play the role of transferring the signals outputted from the backside illumination photodiodes 1011, to the floating diffusion nodes.

Then, as shown in (b) of FIG. 10, first vias 1021 and first metal layers 1022 are formed in a first interlayer dielectric layer 1020 on the first wafer 1010 (S920).

As shown in (c) of FIG. 10, first bonding vias 1023 are formed in the first interlayer dielectric layer 1020 (S930).

For reference, the first bonding vias 1023 perform the same function as the first bonding vias 520T of FIG. 5.

At the same time with forming the backside illumination photodiodes 1011, the transfer transistors 1012, the first vias 1021 and the first bonding vias 1023 on the first wafer 1010 as described above, the following elements are formed on a second wafer 1030.

As shown in (d) of FIG. 10, on the second wafer 1030, pixel transistors 1031 (for example, reset transistors, drive transistors and select transistors) for transferring signals corresponding to the light sensed through the backside illumination photodiodes 1011, to corresponding pixels are formed (S940).

The pixel transistors 1031 function to transfer the signals transferred through the floating diffusion nodes from the backside illumination photodiodes 1011, to the corresponding pixels.

Next, as shown in (e) of FIG. 10, second vias 1041 and second metal layers 1042 are formed in a second interlayer dielectric layer 1040 on the second wafer 1030 (S950).

As shown in (f) of FIG. 10, second bonding vias 1043 are formed in the second interlayer dielectric layer 1040 (S960).

For reference, the second bonding vias 1043 perform the same function as the second bonding vias 520B of FIG. 5.

Thereafter, as shown in (g) of FIG. 10, the first interlayer dielectric layer 1020 on the first wafer 1010 and the second interlayer dielectric layer 1040 on the second wafer 1030 are bonded with each other, and at this time, the first bonding vias 1023 on the first wafer 1010 and the second bonding vias 1043 on the second wafer 1030 are electrically connected with each other (S970).

Thereupon, as shown in (h) of FIG. 10, a passivation process, a process for forming color filters 1050 and a process for forming microlenses 1060 are performed (S980), and finally, a process for forming pads 1070 is performed (S990).

Meanwhile, in an embodiment different from the above-described embodiments, a first wafer may include pixel transistors (for example, reset transistors, drive transistors and select transistors) in addition to backside illumination photodiodes, transfer transistors and floating diffusion nodes. In this case, first metal layers are electrically connected to pixel regions. In a second wafer, logic transistors for processing the signals outputted from the pixel transistors are formed and are electrically connected with the first wafer.

As is apparent from the above descriptions, when manufacturing an image sensor through a 3D CIS (CMOS image sensor) manufacturing process, two wafers, that is, a first wafer and a second wafer are electrically connected using the vias of one wafer and the bonding pads of the other wafer. As a consequence, the manufacturing process may be simplified since the number of pad forming processes is decreased to one half, and thereby, the manufacturing cost may be reduced.

Also, when manufacturing an image sensor through a 3D CIS manufacturing process, two wafers, that is, a first wafer and a second wafer are electrically connected using the vias of both the first and second wafers. As a consequence, the manufacturing yield may be increased since a process margin for a misalignment is secured, and the characteristic of a pixel may be improved since parasitic capacitance is reduced.

Further, in the case of bonding wafers in which pitches of top and bottom metals are different, since the sizes of bonding contact surfaces are determined to be the same, a bonding force may be increased.

While various embodiments have been described above, it will be understood to those skilled in the art that the embodiments described are by way of example only. Accordingly, the disclosure described herein should not be limited based on the described embodiments.

What is claimed is:

1. An image sensor using backside illumination photodiodes, comprising:
    a plurality of first metal layers formed in a first wafer including a plurality of backside illumination photodiodes which sense light incident from a backside and output signals and a plurality of transfer transistors which transfer the signals outputted from the backside illumination photodiodes, to floating diffusion nodes, the plurality of first metal layers being electrically connected with the floating diffusion nodes, respectively;

a plurality of second metal layers formed in a second wafer including a plurality of pixel transistors which process signals transferred through the floating diffusion nodes and transfer processed signals, the plurality of second metal layers being electrically connected with the pixel transistors, respectively;

a plurality of first bonding vias formed in the first wafer, and having one ends which are electrically connected to the first metal layers, respectively; and a plurality of second bonding vias formed in the second wafer, and having one ends which are electrically connected to the second metal layers, respectively, and the other ends which are electrically connected to the other ends of the first bonding vias, respectively, wherein the first bonding vias are formed to have inclined surfaces in the case where a size of the first metal layers is smaller than a size of the second metal layers, and the second bonding vias are formed to have inclined surfaces in the case where a size of the first metal layers is larger than a size of the second metal layers.

2. The image sensor according to claim 1, wherein the first bonding vias and the second bonding vias are formed to have the same contact area.

3. The image sensor according to claim 1, wherein an angle of the inclined surfaces is 3° to 10°.

4. The image sensor according to claim 1, wherein the second wafer further includes logic transistors for processing the signals outputted through the pixel transistors.

5. The image sensor according to claim 1, wherein the pixel transistors comprise at least ones of:

drive transistors electrically connected to a power terminal through one terminals thereof, and configured to be driven according to voltages supplied continuously through the floating diffusion nodes and gates thereof and output output voltages corresponding to the light sensed through the backside illumination photodiodes, through the other terminals thereof;

select transistors electrically connected to the other terminals of the drive transistors through one terminals thereof, and configured to selectively output the output voltages of the drive transistors according to a select control signal supplied through gates thereof; and reset transistors configured to supply a voltage of the power terminal to the gates of the drive transistors, and reset the floating diffusion nodes, in a reset mode.

6. A method for manufacturing an image sensor using backside illumination photodiodes, comprising:

(a) forming a plurality of backside illumination photodiodes which sense light incident from a backside and output signals and a plurality of transfer transistors which transfer the output signals of the backside illumination photodiodes to floating diffusion nodes, in a first wafer having a plurality of first metal layers, and forming a plurality of first bonding vias which are electrically connected with the floating diffusion nodes, in an interlayer dielectric layer of the first wafer;

(b) forming a plurality of pixel transistors for processing the output signals of the backside illumination photodiodes and transferring processed signals, in a second wafer having a plurality of second metal layers, and forming a plurality of second bonding vias which are electrically connected with the pixel transistors, in an interlayer dielectric layer of the second wafer; and (c) bonding the first wafer and the second wafer, and electrically connecting the first bonding vias and the second bonding vias with each other, wherein the first bonding vias are formed to have inclined surfaces in the case where a size of the first metal layers is smaller than a size of the second metal layers, and the second bonding vias are formed to have inclined surfaces in the case where a size of the first metal layers is larger than a size of the second metal layers.

7. The method according to claim 6, further comprising:
performing a passivation process, a color filter forming process, a microlens forming process and a pad forming process, after completing (c).

8. The method according to claim 6, wherein the pixel transistors comprise at least ones of:

drive transistors electrically connected to a power terminal through one terminals thereof, and configured to be driven according to voltages supplied continuously through the floating diffusion nodes and gates thereof and output output voltages corresponding to the light sensed through the backside illumination photodiodes, through the other terminals thereof;

select transistors electrically connected to the other terminals of the drive transistors through one terminals thereof, and configured to selectively output the output voltages of the drive transistors according to a select control signal supplied through gates thereof; and reset transistors configured to supply a voltage of the power terminal to the gates of the drive transistors, and reset the floating diffusion nodes, in a reset mode.

\* \* \* \* \*